United States Patent
Kagaya (10) Patent No.: US 12,027,815 B2
(45) Date of Patent: Jul. 2, 2024

(54) OPTICAL MODULE

(71) Applicant: CIG Photonics Japan Limited, Kanagawa (JP)

(72) Inventor: Osamu Kagaya, Tokyo (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 707 days.

(21) Appl. No.: 17/223,093

(22) Filed: Apr. 6, 2021

(65) Prior Publication Data

US 2021/0359488 A1    Nov. 18, 2021

(30) Foreign Application Priority Data

May 15, 2020  (JP) ................. 2020-086200

(51) Int. Cl.
*H01S 5/00* (2006.01)
*G02F 1/015* (2006.01)
*H01P 3/08* (2006.01)

(52) U.S. Cl.
CPC .......... *H01S 5/0085* (2013.01); *G02F 1/0157* (2021.01); *H01P 3/08* (2013.01)

(58) Field of Classification Search
CPC ......... H01S 5/0085; G02F 1/0157; H01P 3/08
(Continued)

(56) References Cited

U.S. PATENT DOCUMENTS

| 5,781,578 A | 7/1998 | Takagi | |
| 2006/0007516 A1* | 1/2006 | Kagaya | G02F 1/0121 359/245 |

(Continued)

FOREIGN PATENT DOCUMENTS

| CN | 1722551 A | 1/2006 |
| CN | 101071808 A | 11/2007 |

(Continued)

OTHER PUBLICATIONS

Chinese Office Action received in corresponding Chinese Application No. 202110529840.7 dated Jun. 6, 2022.

(Continued)

*Primary Examiner* — Stephone B Allen
*Assistant Examiner* — Leonidas Boutsikaris
(74) *Attorney, Agent, or Firm* — MATTINGLY & MALUR, PC (57) ABSTRACT

Each semiconductor device includes a semiconductor laser unit and an optical modulator unit. Each transmission line is configured to transmit a drive signal to the optical modulator unit. Each resistor is provided for the transmission line and configured to terminate the drive signal. Each first conductive pattern is connected to one electrode of the semiconductor laser unit and one electrode of the optical modulator unit. Each chip capacitor has one electrode connected to another electrode of the semiconductor laser unit through a bonding wire. Each chip capacitor has another electrode connected to the first conductive pattern that is connected to the semiconductor laser unit. Each second conductive pattern is connected to the resistor, directly or through a DC blocking capacitor. Each third conductive pattern is connected to each of the first conductive pattern and the second conductive pattern through a conductive via hole in the chip carrier.

4 Claims, 8 Drawing Sheets

(58) Field of Classification Search
USPC .......................................................... 359/245
See application file for complete search history.

(56) References Cited

U.S. PATENT DOCUMENTS

| | | |
|---|---|---|
| 2006/0008194 A1 | 1/2006 | Kagaya et al. |
| 2007/0248363 A1 | 10/2007 | Kagaya |
| 2010/0079222 A1* | 4/2010 | Makita ................. H01L 23/66 216/17 |
| 2012/0128290 A1 | 5/2012 | Han et al. |
| 2017/0310078 A1* | 10/2017 | Hirayama ........... H01S 5/02345 |
| 2018/0123697 A1* | 5/2018 | Kubota ................ G02B 27/283 |
| 2019/0131762 A1 | 5/2019 | Hirayama |
| 2019/0237934 A1 | 8/2019 | Adachi et al. |

FOREIGN PATENT DOCUMENTS

| | | |
|---|---|---|
| CN | 108008550 A | 5/2018 |
| JP | 10-51069 A | 2/1998 |
| JP | 2007-286454 | 11/2007 |
| JP | 5475404 B2 | 4/2014 |
| JP | 2017-199905 A | 11/2017 |
| JP | 2017-199906 A | 11/2017 |
| JP | 2019-134056 A | 8/2019 |

OTHER PUBLICATIONS

Japanese Office Action received in corresponding Japanese Application No. 2020-086200 dated Jan. 23, 2024.

* cited by examiner

Prior Art

OPTICAL MODULE

CROSS-REFERENCE TO RELATED APPLICATION

The present application claims priority from Japanese patent application JP2020-086200 filed on May 15, 2020, the contents of which are hereby incorporated by reference into this application.

BACKGROUND

1. Field

The disclosure relates to an optical module having a chip carrier with a mounting surface on which a semiconductor device is mounted, the semiconductor device including a semiconductor laser unit and an optical modulator unit.

2. Description of the Related Art

An optical transceiver for optical fiber transmission has been made faster, smaller, and lower in cost, with popularization of broadband networks in recent years, and a high-speed optical transceiver having a bit rate of 100 Gbit/s has now been widely used. In terms of downsizing and cost reduction, the reduction of case volume and the reduction of the number of components are progressing from CFP MSA (Centum gigabit Form factor Pluggable Multi-Source Agreement) standard to CFP2, CFP4, or QSFP28 (MSA standard).

These optical transceivers often use an optical modulator integrated semiconductor laser in the transmission unit. The optical modulator integrated semiconductor laser is a semiconductor device obtained by integrating a semiconductor laser unit made of a semiconductor laser diode and an optical modulator unit made of an electro-absorption optical modulator on one chip. The optical modulator integrated semiconductor laser is mounted on a small substrate, called a chip carrier and made of mainly ceramics, to be selected depending on high frequency operation characteristics or to be mounted on TEC (thermoelectric cooler).

There are JP 5475404B and JP 2019-134056A for background techniques of the present technical field. In these documents, a problem is described in which modulation signals for driving an optical modulator unit fluctuate a potential of a semiconductor laser unit which is originally required to operate in a direct current. Especially, they describe how to suppress the potential variation around the frequency range with high gain of the semiconductor laser unit, that is, around the relaxation oscillation frequency.

Another background art is disclosed in JP 2017-199905A. This document discloses that some chip carriers arranged close to each other in parallel may lead to a problem where modulation signals for driving one optical modulator unit fluctuate a potential of another adjacent optical modulator unit.

For downsizing, the optical transceiver of 100 Gbit/s-class transmission speed tends to use one optical sub-assembly (OSA) in which four semiconductor lasers and an optical system including an optical multiplexer are integrated in the transmission unit. For cost reduction, the optical sub-assembly should have one chip carrier having a surface on which four optical modulator integrated semiconductor lasers and four transmission lines for transmitting modulation signals for driving their optical modulator units are integrated. Additionally, reduction in area of the chip carrier is preferable in terms of both downsizing and cost reduction. On the other hand, a four-valued pulse-amplitude modulation (PAM) method is becoming the mainstream as a technique for further doubling the transmission rate. The PAM4 system has a voltage discrimination range ⅓ or less as wide as the conventional binary (NRZ or PAM2), requiring higher waveform quality than before, that is, a lower noise and a lower jitter.

By providing four optical modulator integrated semiconductor lasers, four decoupling capacitors to suppress the potential variation of the semiconductor laser unit, and four transmission lines for transmitting modulation signals for driving the optical modulator units, on a surface of the small chip carrier, the optical modulator integrated semiconductor lasers and the decoupling capacitors are close to the transmission lines. The modulation signal generates a magnetic field in the vicinity of the transmission line, thereby generating an electromotive force in the loop path between the semiconductor laser unit and the decoupling capacitor. The closer they are, the more the electromotive force becomes, whereby the potential variation of the semiconductor laser unit increases. The variation becomes a noise and a jitter in the output light of the semiconductor laser unit, deteriorating the waveform quality of the output light signals of the optical modulator unit. According to our study, the conventional chip carrier structure further increasingly fluctuates the potential of the semiconductor laser unit, leading to a problem, in contrast with the impact posed by providing the optical modulator integrated semiconductor laser and the decoupling capacitor close to the transmission line.

SUMMARY

The disclosure aims at providing an optical module, with a chip carrier on which an optical modulator integrated semiconductor laser is mounted, capable of suppressing potential variation of the semiconductor laser unit caused by the modulation signals for driving the optical modulator unit, whereby downsizing is compatible with improvement of waveform quality.

(1) An optical module includes: semiconductor devices including respective semiconductor laser units and respective optical modulator units; a chip carrier with a mounting surface on which the semiconductor devices are mounted; transmission lines on the chip carrier for the respective optical modulator units, each of the transmission lines configured to transmit a drive signal to a corresponding one of the optical modulator units; resistors on the mounting surface, each of the resistors provided for a corresponding one of the transmission lines and configured to terminate the drive signal; first conductive patterns on the mounting surface, each of the first conductive patterns connected to one electrode of a corresponding one of the semiconductor laser units and one electrode of the corresponding one of the optical modulator units; chip capacitors on the mounting surface for the respective semiconductor laser units, each of the chip capacitors having one electrode connected to another electrode, to which a DC voltage is supplied, of the corresponding one of the semiconductor laser units through a bonding wire, each of the chip capacitors having another electrode connected to a corresponding one of the first conductive patterns that is connected to the corresponding one of the semiconductor laser units; second conductive patterns on the mounting surface, the second conductive patterns separated from the first conductive patterns, each of the second conductive patterns connected to one electrode of a corresponding one of the resistors, directly or through a DC blocking capacitor; and third conductive patterns on a surface opposite to the mounting surface of the chip carrier or in an inner layer of the chip carrier, each of the third conductive patterns connected to the corresponding one of the first conductive patterns through a conductive via hole in the chip carrier, and connected to a corresponding one of the second conductive patterns through a conductive via hole in the chip carrier.

(2) In the optical module according to (1), the transmission lines may be waveguides with signal line conductors and a ground conductor parallel to the signal line conductors, each of the signal line conductors connected through a bonding wire to another electrode of the corresponding one of the optical modulator units and another electrode of the corresponding one of the resistors, at least part of each of the transmission lines being a grounded coplanar waveguide with the ground conductor, the ground conductor including the first conductive patterns, to which the semiconductor devices and the chip capacitors are connected in response to the respective transmission lines, the ground conductor including the third conductive patterns. Each of the semiconductor devices and each of the chip capacitors, on the corresponding one of the first conductive patterns, may be adjacent to a corresponding one of the signal line conductors of the corresponding one of the transmission lines.

(3) In the optical module according to (2), the semiconductor devices may be n semiconductor devices, where the n is an integer of two or more, arranged in a row along a first direction on the mounting surface. Each of the transmission lines may extend in a second direction perpendicular to the first direction. The first conductive patterns, the second conductive patterns, and the signal line conductors may include a j-th first conductive pattern, a j-th second conductive pattern, and a j-th signal line conductor, respectively, corresponding to a j-th one of the semiconductor devices from an end of the row, where the j is an arbitrary natural number of the n or less. The j-th second conductive pattern may be opposite to the j-th signal line conductor across the j-th one of the semiconductor devices. The transmission lines may include one section and another section, serving as the ground conductor, on each of both sides of a k-th one of the signal line conductors, where the k is an arbitrary natural number equal to or less than n−1. The one section may include a k-th one and a (k+1)-th one of the first conductive patterns. The other section may include the k-th one of the first conductive patterns and a (k+1)-th one of the second conductive patterns.

(4) In the optical module according to any one of (1) to (3), the semiconductor devices may be arranged in a row in a first direction on the mounting surface at one end of the chip carrier in a second direction intersecting the first direction. The transmission lines may have respective input terminals at another end of the chip carrier in the second direction.

The optical module, with the chip carrier on which the optical modulator integrated semiconductor laser is mounted, is capable of suppressing the potential variation of the semiconductor laser unit caused by the modulation signals for driving the optical modulator unit, whereby downsizing is compatible with cost reduction.

DETAILED DESCRIPTION

Hereinafter, embodiments of the present invention will be described with reference to the drawings. In the embodiment described below, for example, an OSA having an optical transmission function or an optical transceiver incorporating the OSA corresponds to an optical module of the present invention. In all the drawings for explaining the embodiments, members having the same functions are denoted by the same reference numerals, and repetitive descriptions thereof are omitted. In addition, the drawings shown below explain examples of embodiments only, and the size in the drawings does not necessarily coincide with the scale of the present embodiment.

First Embodiment

Figure 1:
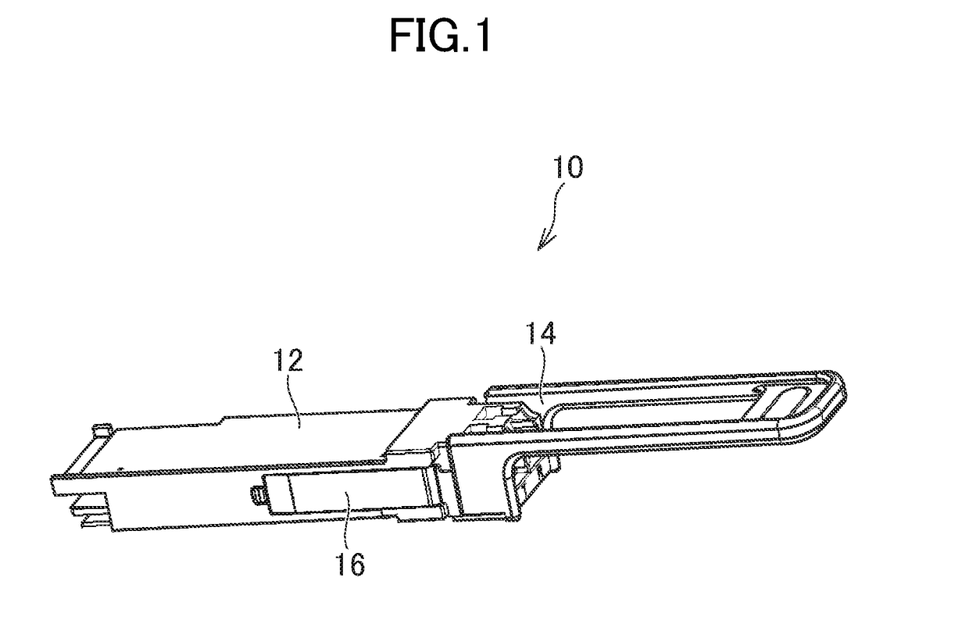
FIG. 1 is a schematic external view of an optical transceiver in an embodiment.

FIG. 1 is a perspective view of an example of an external appearance of an optical transceiver 10 according to an embodiment. In this example, the optical transceiver 10 is composed of parts such as a case 12, a pull tab 14, and a slider 16.

Figure 2:
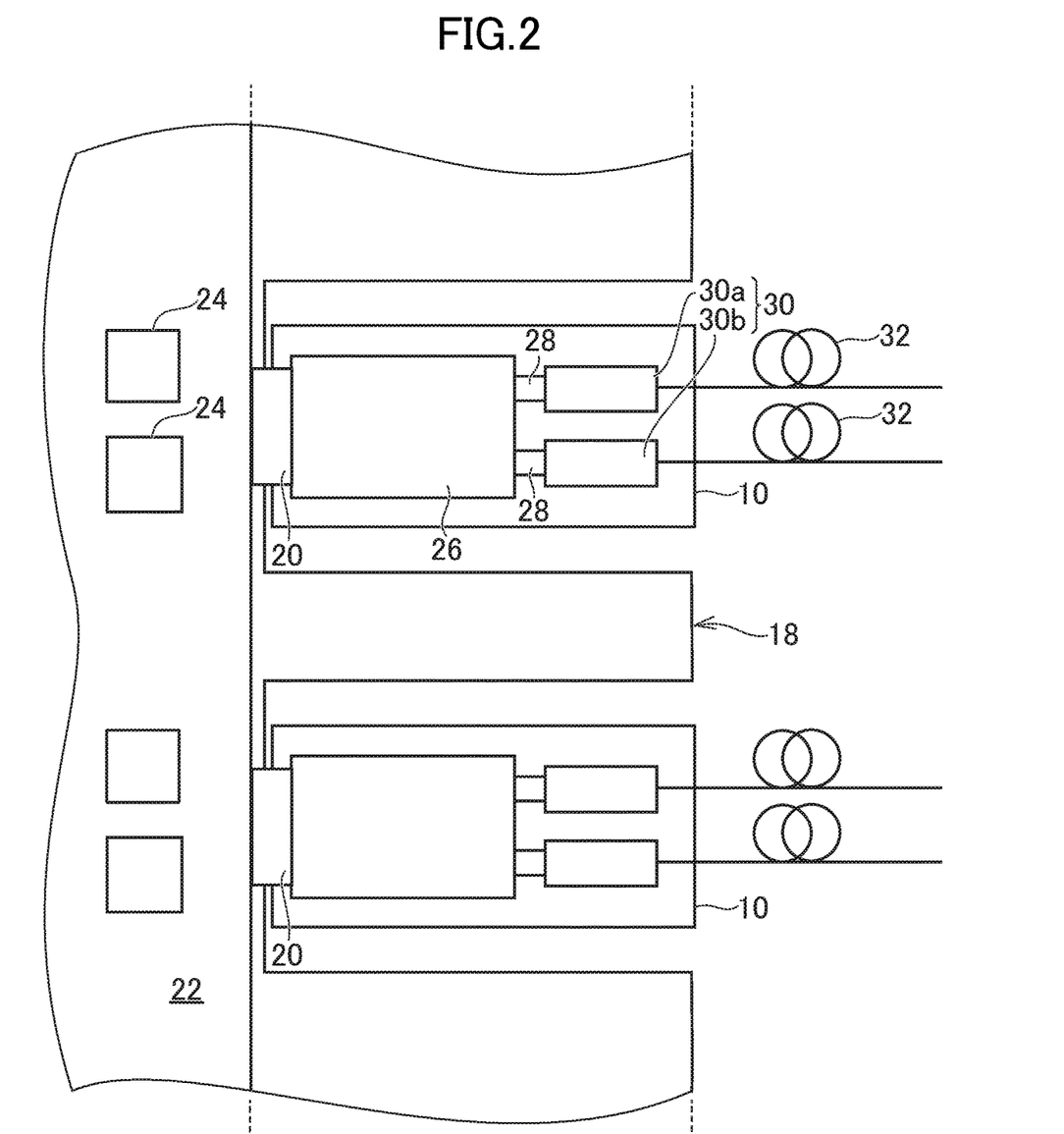
FIG. 2 is a schematic diagram of a configuration of an optical transmission device in the embodiment.

FIG. 2 is a schematic top view of the configuration of an optical transmission device 18 to which the optical transceiver 10 is attached. Some optical transceivers 10 are attached to the optical transmission device 18 through respective electrical connectors 20.

Here, for convenience of explanation, the XYZ orthogonal coordinate system is defined as a right-handed system, where the horizontal right direction in FIG. 2 is the positive direction of the X-axis, the vertical upward direction is the positive direction of the Y-axis, the direction coming from the paper surface is the positive direction of the Z-axis. Further, the XY plane is the horizontal plane, and the Z-axis is the vertical direction. Incidentally, the optical transceiver 10 in FIG. 2 is attached, with the longitudinal direction of the elongated case 12 in FIG. 1 parallel to the X-axis.

The optical transmission device 18 is, for example, a large-capacity router or switch. The optical transmission device 18 may have a function of a switch for being installed at a base station. The optical transmission device 18 is configured to acquire data for reception (electrical signal for reception) from the optical transceiver 10, use a driver IC (integrated circuit) 24 mounted on the circuit board 22 to determine which data to transmit to where, generate data for transmission (electrical signal for transmission), and transmit the data to the corresponding optical transceiver 10.

The optical transceiver 10 includes a printed circuit board 26, a flexible printed circuit board 28, and an optical sub-assembly (OSA) 30 for converting optical and electrical signals. Further, an optical fiber 32 is connected to the OSA 30 for inputting and outputting the optical signal.

The OSA 30 is specifically either a transmitter optical sub-assembly (TOSA) having an optical transmission function, a receiver optical sub-assembly (ROSA) having an optical reception function, or a bi-directional optical sub-assembly (BOSA) having an optical transmission and reception function. In this embodiment, the optical transceiver 10 includes a TOSA 30*a* and a ROSA 30*b* as the OSA 30.

The printed circuit board 26 is a non-flexible rigid substrate, whereas the flexible printed circuit board 28 is flexible and both ends of it are connected to the printed circuit board 26 and the OSA 30. That is, one end of the interconnection line on the flexible printed circuit board 28 is electrically connected to the terminal of the OSA 30, and the other end of the interconnection line is electrically connected to the terminal of the printed circuit board 26, whereby the electric signals are transmitted between the printed circuit board 26 and the OSA 30 through the interconnection line. For example, electrical signals from the printed circuit board 26 are transmitted to the TOSA 30*a* through the flexible printed circuit board 28, whereas electrical signals from the ROSA 30*b* are transmitted to the printed circuit board 26 through the flexible printed circuit board 28.

The OSA 30 has an outer case or a housing that contains a chip carrier on which an optical semiconductor device is mounted. The optical transceiver 10 has an electrical connector 20 at one end in the X direction and the optical fiber 32 is connected to the other end, and accordingly the OSA has a terminal connected to the flexible printed circuit board 28 at one end in the X direction and an optical fiber connector at the other end.

For example, in the present embodiment, the optical transceiver 10 enables high-speed signal transmission such as 100 Gbit/s. Therefore, the OSA 30 contains some optical semiconductor devices. For example, in the present embodiment, the OSA 30 includes four optical semiconductor devices.

Incidentally, the optical semiconductor device is a photoelectric transducer for converting an optical signal and an electrical signal from one to another. Specifically, the TOSA 30*a* includes an optical modulator integrated semiconductor laser as a photoelectric transducer for converting the electrical signal to the optical signal; the ROSA 30*b* includes a photoreceptor such as a photodiode, as a photoelectric transducer for converting the optical signal to the electrical signal.

Figure 3:
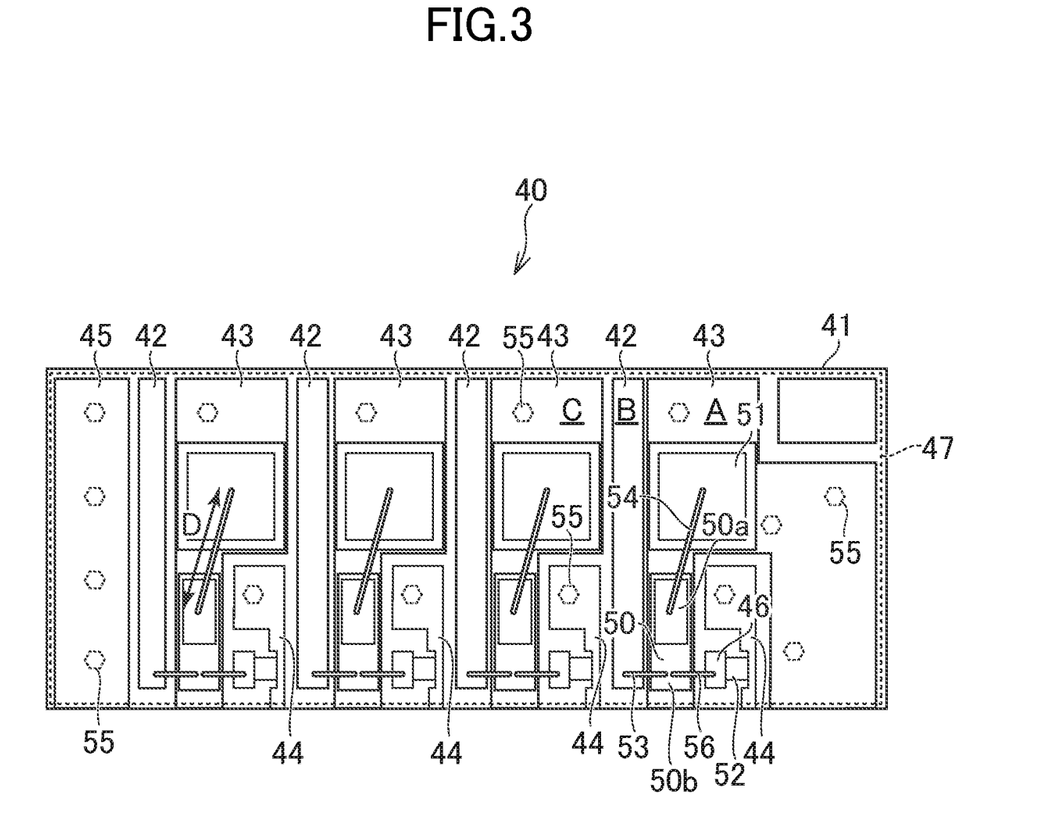
FIG. 3 is a schematic top view of a chip carrier in the first embodiment.

FIG. 3 is a schematic top view of a chip carrier 40 in the TOSA 30*a*, showing an example of the mounting surface of the chip carrier 40, and elements and conductive patterns disposed thereon.

The chip carrier 40 is mainly composed of a carrier substrate 41 made of dielectric, and a conductive pattern disposed on its upper surface (top surface) and its lower surface (back surface). Here, the upper surface of the carrier substrate 41 is a mounting surface, for arranging parts such as optical semiconductor devices, on which a strip conductor 42, some conductive patterns 43 to 45, and a surface layer electrode 46 are formed from a conductive film such as a metal. A conductive pattern 47 is also formed on the lower surface of the carrier substrate 41. The conductive pattern 47 is basically formed in an underside area overlapping with the conductive patterns 43 to 45 on the mounting surface, and may be formed substantially all over the entire lower surface. An optical modulator integrated semiconductor laser 50, a chip capacitor 51, and a resistor 52 are disposed on the mounting surface.

The carrier substrate 41 may be made of aluminum nitride (AlN). Due to superior thermal conductivity to other dielectrics, the aluminum nitride is suitable for the chip carrier 40 mounted on a Peltier device, for precise temperature control of the optical modulator integrated semiconductor laser 50, on.

The optical modulator integrated semiconductor lasers 50, which are optical semiconductor devices, are built in the TOSA 30*a* as described above, the number thereof in this embodiment is four, and the TOSA 30*a* includes basically the same circuits of four lanes in parallel. Each optical modulator integrated semiconductor laser 50 includes a semiconductor laser unit 50*a* and an optical modulator unit 50*b*. The chip carrier 40 has a transmission line provided for each optical modulator unit 50*b* for transmitting a drive signal to each optical modulator unit 50*b*.

The optical modulator integrated semiconductor laser 50 may be formed using an n-InP substrate. The semiconductor laser unit 50*a* is a distributed feedback (DFB) type laser; the optical modulator unit 50*b* is an electro-absorption (EA) type modulator. Electrodes of the semiconductor laser unit 50*a* and the optical modulator unit 50*b* may be disposed on the upper surface and the lower surface of the optical modulator integrated semiconductor laser 50. The upper electrode of the semiconductor laser unit 50*a* is connected to the DC power source VLD. The upper electrode of the optical modulator unit 50*b* is connected to the drive signal source DRV. Specifically, the upper electrode of the optical modulator unit 50*b* is connected through a bonding wire 53 to the strip conductor 42 constituting the transmission line. Further, the semiconductor laser unit 50*a* and the optical modulator unit 50*b* have the respective lower electrodes connected to a reference potential (ground potential).

The conductive pattern 43 is a first conductive pattern, provided for each optical modulator integrated semiconductor laser 50, and is connected to one electrode of each of the semiconductor laser unit 50*a* and the optical modulator unit 50*b* of the optical modulator integrated semiconductor laser 50. Specifically, the optical modulator integrated semiconductor laser 50 is disposed on the conductive pattern 43; the lower surface electrodes of the semiconductor laser unit 50*a* and the optical modulator unit 50*b* are connected to the conductive pattern 43.

The chip capacitor 51 is provided for each optical modulator integrated semiconductor laser 50, and has one electrode connected through a bonding wire 54 to another electrode of the semiconductor laser unit 50*a* of the optical modulator integrated semiconductor laser 50. Another electrode of the chip capacitor 51 is connected to the conductive pattern 43 to which the semiconductor laser unit 50*a* is connected. The chip capacitor 51 is configured to suppress variation of the DC voltage supplied to the semiconductor laser unit 50*a*, thereby being referred to as a decoupling capacitor. The chip capacitor 51 should have electrodes on the upper and lower surfaces to have a small inductance value in series, leading to a configuration where the chip capacitor 51 is disposed on the conductive pattern 43, the lower electrode of the chip capacitor 51 is connected to the conductive pattern 43, and the upper electrode thereof is connected to the upper electrode of the semiconductor laser unit 50*a* through a bonding wire 54. The capacitance value of the chip capacitor 51 is, for example, 0.1 microfarads [μF].

The resistor 52 is provided for each optical modulator integrated semiconductor laser 50 and is a terminating resistor for terminating the drive signal of the transmission line corresponding to each optical modulator integrated semiconductor laser 50. The resistor 52 may be a thick film resistor, has one electrode connected to the conductive pattern 44, and has another electrode connected to a surface layer electrode 46. The resistance value of the resistor 52 is set to be 50 ohms [Ω].

The conductive pattern 44 is a second conductive pattern and is separated from the conductive pattern 43, which is the first conductive pattern, on the mounting surface. The conductive pattern 44 is also provided for each optical modulator integrated semiconductor laser 50; one electrode of the resistor 52 provided corresponding to the optical modulator integrated semiconductor laser 50 is directly connected to the conductive pattern 44.

The conductive pattern 47 is a third conductive pattern and is connected to a reference potential (ground potential). The conductive pattern 47 is connected to the conductive pattern 43 and the conductive pattern 44 through conductive via holes 55 formed in the chip carrier 40. That is, each conductive pattern 43 and each conductive pattern 44 are separated from each other on the mounting surface of the chip carrier 40 but are electrically connected to each other through the conductive via holes 55 and the conductive pattern 47 to be a ground conductor. Tungsten may be used for the material of the conductive via holes 55.

The strip conductor 42 is a signal line conductor of the transmission line and is provided for each transmission line. A drive signal is supplied from the drive signal source DRV to the strip conductor 42. As described above, the upper surface electrode of the optical modulator unit 50b is connected to the strip conductor 42 through the bonding wire 53 to receive drive signals. Furthermore, the bonding wire 56 connects between the surface electrode 46, to which the resistor 52 is connected, and the upper surface electrode of the optical modulator unit 50b; the resistor 52 is electrically connected to the strip conductor 42. Thus, the resistor 52 is connected between the signal line conductor and a ground conductor of the transmission line, and serves as a terminating resistor of the transmission line.

The transmission line is a waveguide with the strip conductor 42 and the ground conductor parallel to the strip conductor 42. Specifically, the waveguide may be composed of the carrier substrate 41 which is a dielectric, the strip conductor 42 provided on its upper surface, the conductive pattern 43 and the conductive pattern 44 which are the ground conductor on the upper surface, and the conductive pattern 47 which is the ground conductor on the lower surface. In particular, the transmission line at least a portion thereof has a structure of a grounded coplanar waveguide (G-CPW) including the conductive pattern 43 connected to the optical modulator integrated semiconductor laser 50 and the chip capacitor 51 corresponding to the transmission line, and the conductive pattern 47 for the ground conductor; the optical modulator integrated semiconductor laser 50 and the chip capacitor 51 are disposed, on the conductive pattern 43, at a position adjacent to the strip conductor 42 of the corresponding transmission line. This point will be described further below.

Figure 4:
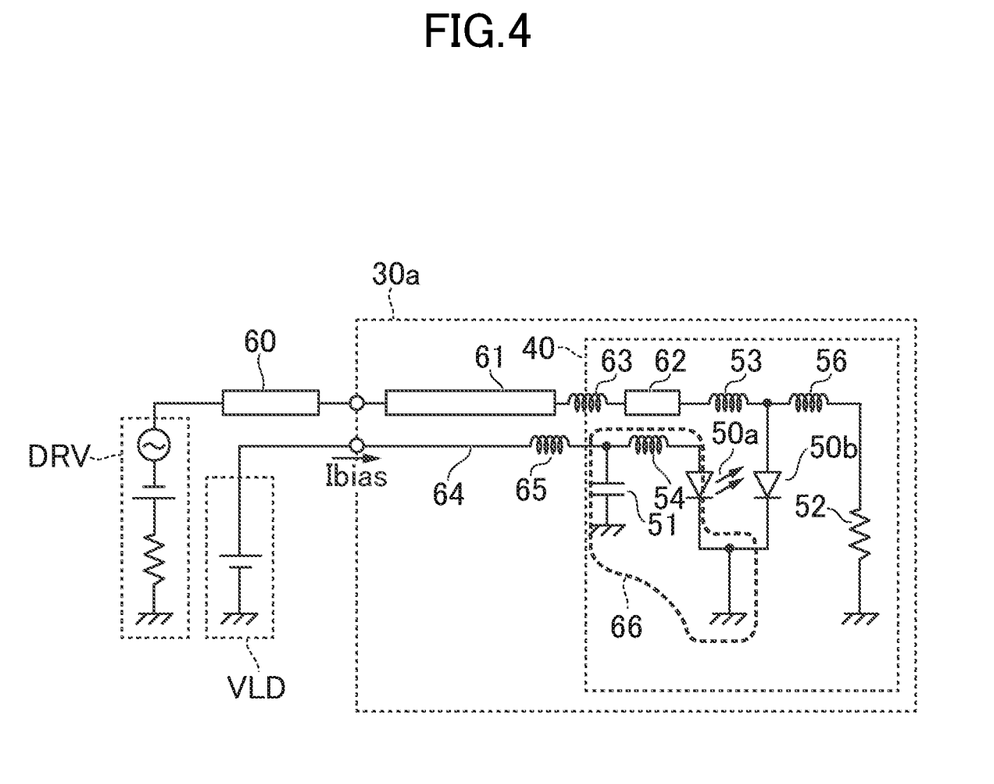
FIG. 4 is a schematic circuit diagram of a TOSA in the embodiment.

FIG. 4 is a schematic circuit diagram of the TOSA 30a including the chip carrier 40 in FIG. 3. The circuit diagram is part of the transmission unit of the optical transceiver 10 and is a simplified description of one of the circuits of the four lanes in the TOSA 30a. The drive signal source DRV may be disposed on the printed circuit board 26 of the optical transceiver 10. The drive signals output from the drive signal source DRV are supplied to the terminals of TOSA 30a through the printed circuit board 26 and the transmission line 60 on and the flexible printed circuit board 28, further transmitted to the transmission line 62 on the chip carrier 40 through the transmission line 61 in TOSA 30a. Incidentally, the transmission line 61 and the transmission line 62 are connected possibly through a bonding wire 63.

Here, the transmission line 62 is a transmission line including the strip conductor 42 described above as the signal line conductor; the drive signals are input to the optical modulator unit 50b through the bonding wire 53 from the transmission line. Further, the strip conductor 42 is connected to the resistor 52 through the bonding wires 53, 56. The terminal of the resistor 52 on the side opposite to the side connected to the strip conductor 42 is connected to the conductive pattern 44, which is a second conductive pattern described above, and is grounded. On the other hand, the optical modulator unit 50b is connected to the conductive pattern 43, which is a first conductive pattern, and is grounded. The drive signals transmitted through the transmission line 62 are absorbed by the resistor 52, which is a terminating resistor, thereby suppressing generation of unnecessary reflected waves leading to deterioration of the waveform quality.

The DC power source VLD is configured to supply power through the printed circuit board 26 and the flexible printed circuit board 28 to the interconnection line 64 in TOSA 30a. The interconnection line 64 is, for example, connected to the upper electrode of the chip capacitor 51 through a bonding wire 65, and the upper electrode is connected to the semiconductor laser unit 50a through a bonding wire 54, whereby the DC current is supplied to the semiconductor laser unit 50a. The chip capacitor 51 as a decoupling capacitor is disposed on the carrier substrate 41, thereby suppressing potential variation between both ends of the semiconductor laser unit 50a due to external voltage variation.

According to this circuit, the semiconductor laser unit 50a is supplied with the DC voltage to generate a laser beam at constant intensity, and the optical modulator unit 50b modulates the intensity of the laser beam from the semiconductor laser unit 50a, in response to the drive signal.

Incidentally, the semiconductor laser unit 50a and the chip capacitor 51, just like the optical modulator unit 50b, are connected to the conductive pattern 43 which is a first conductive pattern, and are grounded. That is, in FIG. 4, the ground symbol to which the semiconductor laser unit 50a and the optical modulator unit 50b are connected is drawn separately from the ground symbol to which the chip capacitor 51 is connected, but it should be noted that these are connected by the common conductive pattern 43.

Referring to FIG. 3 again, the layout of the chip carrier 40 will be described. The four optical modulator integrated semiconductor lasers 50 are arranged to have respective optical axes parallel to each other on the chip carrier 40. The optical axis of each optical modulator integrated semiconductor laser 50 in the present embodiment is set parallel to the X-axis. Further, the arrangement of the optical modulator integrated semiconductor lasers 50 requires that each optical modulator integrated semiconductor laser 50 is not an obstacle to the optical signal emitted from the other optical modulator integrated semiconductor lasers 50. For example, the optical modulator integrated semiconductor lasers 50 should be arranged in a direction intersecting the optical axes. In the present embodiment, the four optical modulator integrated semiconductor lasers 50 are arranged in a row in the Y direction.

The four optical modulator integrated semiconductor lasers 50 are arranged side by side in the Y direction (first direction), and correspondingly the four transmission lines (transmission lines 62 in FIG. 4) on the chip carrier 40 are also provided side by side in the Y direction.

In the present embodiment, the carrier substrate 41 in a plan view has a rectangular shape with sides along the X direction and the Y direction. The four optical modulator integrated semiconductor lasers 50 on the mounting surface are arranged in a row along the Y direction and are disposed at one end of the chip carrier 40 in a second direction intersecting the Y direction. In the present embodiment, the second direction is the X direction, and the optical modulator integrated semiconductor lasers 50 are disposed at one end of the chip carrier 40 in the X direction, i.e., at a portion along the lower side of the carrier substrate 41 in FIG. 3. On the other hand, the input terminals of the transmission line is at the other end in the second direction of the chip carrier 40, i.e., at a portion along the upper side of the carrier substrate 41 in FIG. 3. Incidentally, FIG. 3 shows that one of the four transmission lines has the input terminals indicated by symbols A, B, and C. The input terminal B is a terminal of the strip conductor 42, to which a drive signal is input through a bonding wire 63 from the transmission line 61 in FIG. 4. On the other hand, the input terminals A, C are provided on the respective conductive patterns 43 on both sides along the strip conductor 42.

Incidentally, the upper side in FIG. 3 is a connecting terminal side to the flexible printed circuit board 28 of TOSA 30a, and the lower side is an optical fiber connector side connected to the optical fiber 32. The optical modulator integrated semiconductor laser 50, as shown in FIG. 3, is disposed to have the optical modulator unit 50b on the lower side or one end side of the chip carrier 40, and to have the semiconductor laser unit 50a on the upper side or the other end; the optical modulator integrated semiconductor laser 50 is configured to emit a laser beam downward in FIG. 3.

The strip conductor 42 extends in the X direction; the conductive pattern 43, on which the optical modulator integrated semiconductor laser 50 connected to the strip conductor 42 is mounted, is disposed on one side of both sides along the strip conductor 42. For example, the conductive pattern 43 extends along the strip conductor 42 from one end to the other end and is spaced from the strip conductor 42 with a relatively small predetermined width gap.

The conductive pattern 43 is smaller, in length in the Y direction, around the portion where the optical modulator integrated semiconductor laser 50 is disposed, than the other portions in the X direction. This provides an area which is adjacent to the optical modulator integrated semiconductor laser 50, where the conductive pattern 43 is not provided, and where the resistor 52 and the associated conductive pattern 44 and the surface electrode 46 are provided.

Specifically, the number of the optical modulator integrated semiconductor lasers 50 is represented by n (n=4 in the present embodiment); the optical modulator integrated semiconductor lasers 50 arranged in a row in the Y direction in FIG. 3 include the j-th (j is an arbitrary natural number equal to or less than n) optical modulator integrated semiconductor laser 50 from the right end of the row; the conductive patterns 43, the conductive patterns 44, and the strip conductors 42 include the j-th conductive pattern 43, the j-th conductive pattern 44, and the j-th strip conductor 42, respectively, corresponding to the j-th optical modulator integrated semiconductor laser 50; the j-th conductive pattern 43 in FIG. 3 has a shape in which a portion on the right side of the optical modulator integrated semiconductor laser 50 is cut out, and the length of the conductive pattern 43 in the Y direction at the position of the optical modulator integrated semiconductor laser 50 is smaller than the length of the upper portion in the Y direction. The j-th conductive pattern 44 is disposed in the empty space on the right side of the j-th optical modulator integrated semiconductor laser 50. That is, the j-th conductive pattern 44 is disposed on the opposite side of the j-th strip conductor 42 along the j-th optical modulator integrated semiconductor laser 50.

The conductive patterns 43, 44 are arranged this way for each j, whereby the transmission line has a first section in which the k-th and (k+1)-th conductive patterns 43 (k is any natural number of n−1 or less) are arranged and a second section in which the k-th conductive pattern 43 and the (k+1)-th conductive pattern 44 are arranged, as a ground conductor on each of both sides of the k-th strip conductor 42. Specifically, in FIG. 3, the upper portion of the conductive pattern 43, larger in length in the Y direction, is the first section; the lower portion of the conductive pattern 43, smaller in length in the Y direction, is the second section.

The transmission line in the first section is equipped with the ground conductor including the conductive pattern 43 close to both sides of the strip conductor 42 and including the conductive pattern 47 on the lower surface; the transmission line at least the first section has a G-CPW structure. Also, the conductive pattern 44, just like the conductive pattern 43, serves as the ground conductor, and therefore the second section of the transmission line can also be regarded as the G-CPW structure.

Incidentally, the n-th transmission line includes a conductive pattern 45 on the side opposite to the n-th conductive pattern 43 along the strip conductor 42; the conductive pattern 45 is connected to the conductive pattern 47 through the conductive via holes 55; the conductive pattern 45 serves as the ground conductor of the transmission line with the n-th conductive pattern 43 and the conductive pattern 47. Particularly, the conductive pattern 45 has no optical modulator integrated semiconductor laser 50 or no chip capacitor 51 disposed thereon, but is basically the same as the first conductive pattern 43 in that the input terminal C is provided for the n-th transmission line, whereby the transmission line also has the G-CPW structure.

The structure related to the resistor 52 is disposed in a region adjacent to the optical modulator integrated semiconductor laser 50 as described above, and the surface electrode 46 among them is basically disposed at a position closest to the upper surface electrode of the optical modulator unit 50b, thereby making the bonding wire 56 shorter. In the present embodiment, the direction along which the electrodes at both ends of the resistor 52 are connected, i.e., the direction from the connection point to the surface electrode 46 of the resistor 52 toward the connection point to the conductive pattern 44 is perpendicular to the extending direction of the strip conductor 42, or is the Y direction.

Incidentally, in the configuration in FIG. 3, one electrode of the resistor 52 is directly connected to the conductive pattern 44, whereas a DC blocking capacitor may be interposed between the one electrode of the resistor 52 and the conductive pattern 44. This configuration can cut off the DC current that has occurred in the resistor 52 by the bias voltage applied to the optical modulator unit 50b, thereby reducing power consumption of the optical module. The DC blocking capacitor may be, for example, a chip capacitor with a capacity value of 0.1 μF.

Further, in the configuration shown in FIG. 3, each of the conductive pattern 43 (first conductive pattern) and the conductive pattern 44 (second conductive pattern) on the upper surface of the carrier substrate 41 are configured to be connected to the conductive pattern 47 (third conductive pattern) on the lower surface through the conductive via holes 55, or alternatively the conductive patterns 43, 44 on the upper surface may be connected to the conductive pattern 47 on the lower surface through both the conductive via holes 55 and a conductive pattern that is formed on the side surface of the carrier substrate 41.

Now, as described above, the chip capacitor 51 is provided to suppress the variation of the voltage applied to the semiconductor laser unit 50a. The voltage variation may be caused by, for example, the voltage itself supplied from the DC power source VLD, or may also be caused by other factors. Inside the loop 66, shown by a broken line in FIG. 4, which is composed of the semiconductor laser unit 50a, the bonding wire 54, the chip capacitor 51, and the conductive pattern 43 or the ground conductor, the magnetic field due to the adjacent transmission line 62 spreads. The transmission line 62 is in the grounded coplanar waveguide structure as shown in FIG. 3, and generates the magnetic field that varies in response to the driving signals or modulation signals, in the vicinity of the upper portion of the chip carrier 40, whereby the induced electromotive force of the loop 66 result in the variation factor of the voltage applied to the semiconductor laser unit 50a.

In this regard, in the present embodiment, the center-to-center distance D between the semiconductor laser unit 50a and the chip capacitor 51 is shortened to the extent that no mounting problem occurs. For example, D is 0.57 mm. This enables minimization of the area of the loop and suppression of the potential variation in the semiconductor laser unit 50a due to the modulation signals by reducing the impact on the loop from the magnetic field generated by the transmission line. Further, in the present embodiment, the ground conductor on the upper surface of the carrier substrate 41 is separated into the conductive pattern 43 and the conductive pattern 44, thereby preventing the current generated in the resistor 52 by the drive signal from flowing through the conductive pattern on the upper surface to the ground conductor in the loop. This suppresses the impact on the loop from the magnetic field by the current generated in the resistor 52, thereby suppressing the potential variation of the semiconductor laser unit 50a due to the modulation signals.

The loop shape of the bonding wire 54 should not be raised unnecessarily high but should form a low loop or should have a low loop height to minimize the area of the loop 66 described above.

Further, in the above embodiment, the center-to-center distance D between the semiconductor laser unit 50a and the chip capacitor 51 is shortened to the extent that no mounting problem occurs; this is effective for suppressing the potential variation of the semiconductor laser unit 50a caused by the modulation signals, and is also effective for reducing the inductance of the bonding wire 54 and the inductance of the conductive pattern 43 to which the semiconductor laser unit 50a and the chip capacitor 51 are grounded, thereby leading to effective reduction of the input impedance Z11 between both terminals of the semiconductor laser unit 50a in a high frequency region in which the inductance value is dominant. This can suppresses the variation of the voltage between the both terminals of the semiconductor laser unit 50a due to a noise superimposed on the DC current supplied from the external DC power source VLD, or suppresses the variation of the bias current Ibias, thereby leading to an effect to stabilize the intensity of the output light of the semiconductor laser unit 50a.

Figure 5:
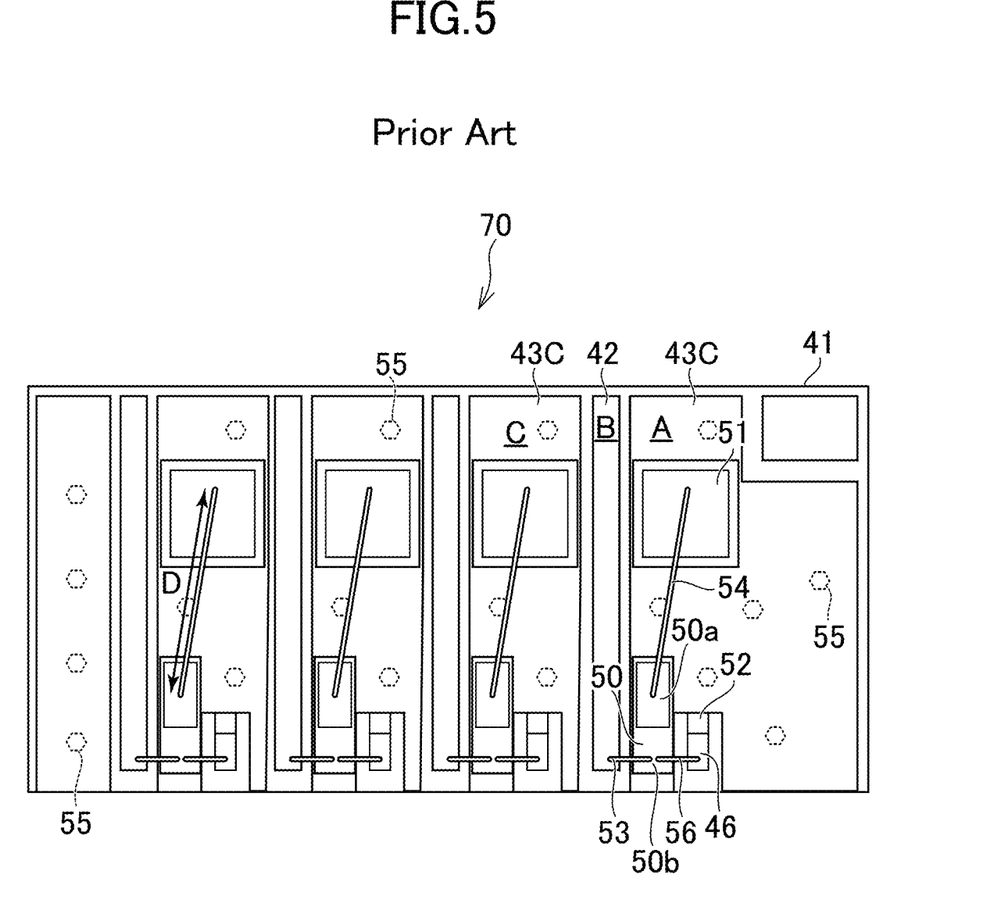
FIG. 5 is a top view of a chip carrier using a prior art.

Next, the effect of the present embodiment will be described with reference to FIGS. 5 to 7. FIG. 5 is a top view of a chip carrier 70 using the prior art. In the conventional chip carrier 70, one electrode of the resistor 52 is directly connected to the first conductive pattern 43C on the mounting surface of the chip carrier 70. That is, in the present embodiment, the ground conductor of the resistor 52 on the chip carrier 40 is a second conductive pattern 44 and is separated on the mounting surface from the first conductive pattern 43, which is a ground conductor of the semiconductor laser unit 50a and the chip capacitor 51; on the conventional chip carrier 70 in FIG. 5, the ground conductor of the resistor 52 and the ground conductors of the semiconductor laser unit 50a and the chip capacitor 51 are not separated on the mounting surface. Further, FIG. 5 shows an example in which the center-to-center distance D between the semiconductor laser unit 50a and the chip capacitor 51 is 0.86 mm.

Figure 6:
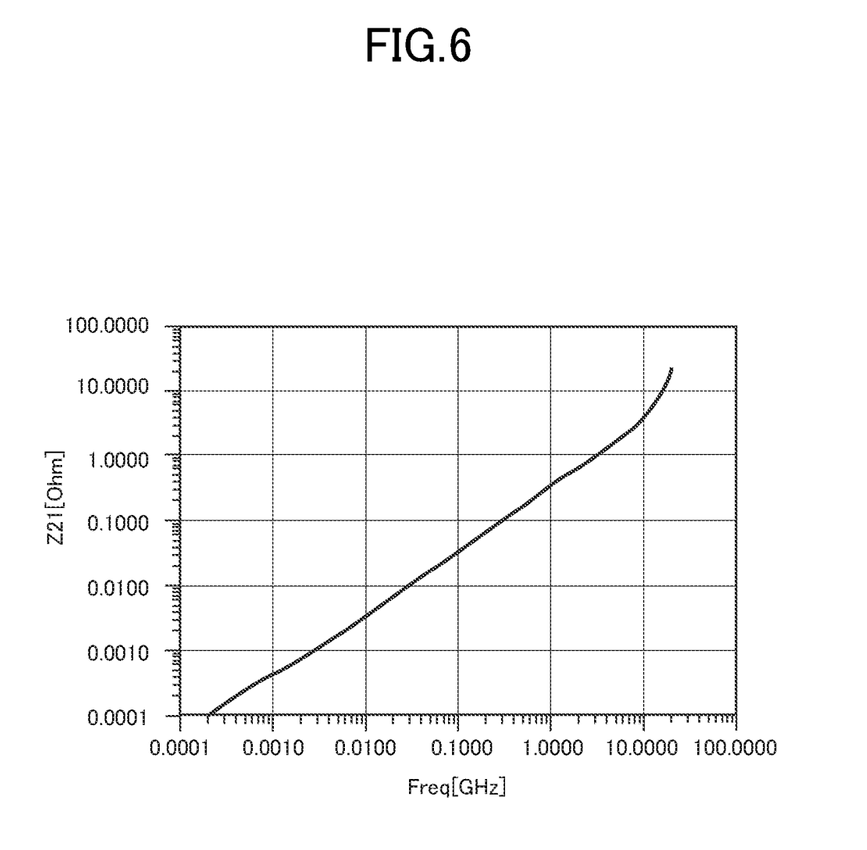
FIG. 6 is a graph chart of frequency characteristics of transfer impedance on the chip carrier from an input terminal of a transmission line to a semiconductor laser unit.

FIG. 6 is a graph chart of frequency characteristics of transfer impedance (Z21) on the chip carrier from an input terminal of a transmission line to a semiconductor laser unit 50a. The graph is a double-logarithmic graph with a horizontal axis for the frequency and a vertical axis for the transfer impedance value, showing the result of calculation using a three-dimensional electromagnetic field analysis tool for the conventional chip carrier 70 in FIG. 5. As this graph shows, the transfer impedance value increases as the frequency increases. Further, in the result in FIG. 6 for the conventional chip carrier 70, the transfer impedance value increases almost ten times as the frequency increases ten times, and the Z21 is 0.33Ω for the frequency of 1 GHz. This means, for example, if the current component at the frequency of 1 GHz of the drive signal at the input terminal of the transmission line is 10 mA, an unwanted noise with amplitude of 3.3 mV occurs at both ends of the semiconductor laser unit 50a. And the effect increases as the frequency increases, deteriorating waveform quality of the output of the semiconductor laser unit 50a in the prior art.

Figure 7:
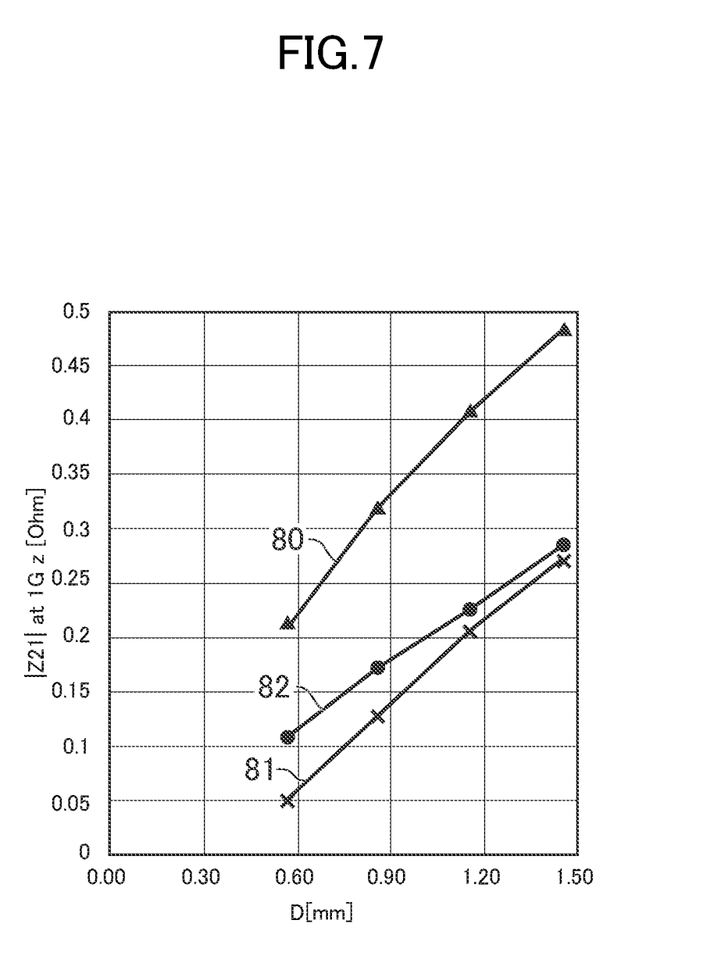
FIG. 7 is a graph chart of how the transfer impedance, on the chip carrier from the input terminal of the transmission line to the semiconductor laser unit, depends on a center-to-center distance between the semiconductor laser unit and a decoupling capacitor.

FIG. 7 is a graph chart of how the transfer impedance Z21, on the chip carrier from the input terminal of the transmission line to the semiconductor laser unit 50a, depends on the center-to-center distance D between the semiconductor laser unit 50a and a chip capacitor 51 or a decoupling capacitor. The graph is a calculation result, by the three-dimensional electromagnetic field analysis tool, with the horizontal axis for the center-to-center distance D and the vertical axis for Z21, where values of Z21 at the frequency of 1 GHz are plotted with the center-to-center distance D varied. The graph 80 shows the result for the conventional chip carrier 70 in FIG. 5, and the graph 81 shows the result for the chip carrier 40 in the present embodiment.

FIG. 7 shows a graph 82 as an analysis result for a comparative example. This analysis is obtained by calculation on a structure consisting only of a loop (loop 66 in FIG. 4) formed by the G-CPW transmission line with the semiconductor laser unit 50a, the bonding wire 54, the chip capacitor 51, and the ground conductor disposed close thereto. Incidentally, this analysis is based on an ideal termination structure on the opposite side of the input terminal of the transmission line. As a result of the graph 82, the transfer impedance Z21 changes substantially in proportion to the distance D. That is, as the area of the loop 66 is reduced, Z21 can be reduced substantially in proportion to the area. Setting the D to 0.86 mm just like the configuration in FIG. 3, the value of Z21 is 0.17Ω at a frequency of 1 GHz.

On the other hand, the chip carrier 70 using the conventional structure in FIG. 5 shows that the value of Z21 changes substantially in proportion to the distance D, but the value of Z21 is approximately twice as large as the experimental result of the comparative example described above where only the transmission line (G-CPW) has an effect. In this regard, we have considered that a current component, transmitted to the optical modulator unit 50b through the bonding wire 53 by drive signals, flows from the resistor 52 to the conductive pattern 43C through the bonding wire 56, and the magnetic field caused by the current component is superimposed on the loops, leading to a factor why the value of the transfer impedance Z21 increases.

Therefore, the chip carrier 40 of the present embodiment has the second conductive pattern 44, for the ground conductor of the resistor 52, separated from the first conductive pattern 43 or the ground conductor of the loop 66, thereby having no current path, after the resistor 52 on the mounting surface, of the current component following the drive signal described above. Thus, the increase in the transfer impedance Z21 can be eliminated as shown in the graph 81 of FIG. 7.

In addition, the graph 81 shows the result that Z21 can be kept lower than the experimental result of the comparative example where only the transmission line (G-CPW) has an effect. This indicates that the chip carrier 40 in the present embodiment eliminates the factors related to the above-mentioned consideration on the increase in the transfer impedance Z21, and besides, has an effect of offsetting, though not completely, the impact from the transmission line G-CPW. The offsetting effect becomes more remarkable as the center-to-center distance D between the semiconductor laser unit 50a and the chip capacitor 51 or the decoupling capacitor shortens. For example, by setting the distance D to 0.57 mm in the present embodiment, the value of Z21 at a frequency of 1 GHz can be reduced to 0.05Ω, which is half or less of the value of 0.11Ω, influenced only by the transmission line (G-CPW).

As described above, according to the present embodiment, the chip carrier 40 on which the optical modulator integrated semiconductor laser 50 is mounted or the optical module (TOSA 30a, optical transceiver 10) including it can suppress the potential variation of the semiconductor laser unit 50a due to the modulation signals for driving the optical modulator unit 50b, thereby providing the chip carrier and the optical module that can balance miniaturization and cost reduction.

In the above embodiment, the chip carrier 40 has some optical modulator integrated semiconductor lasers 50 mounted thereon, illustrating an example of mounting four lasers. However, the number is not limited to four, for example, the chip carrier 40 may have two optical modulator integrated semiconductor lasers mounted thereon. Further, the number of the optical modulator integrated semiconductor lasers 50 to be mounted on the chip carrier 40 may not be multiple, i.e., the present invention is applicable to a chip carrier equipped with one optical modulator integrated semiconductor laser 50, to achieve an effect of suppressing the potential variation of the semiconductor laser unit 50a due to the modulation signals for driving the optical modulator unit 50b.

Further, in the above embodiment, the third conductive pattern 47 is disposed on the back surface of the carrier substrate 41, but the position of the conductive pattern 47 is not limited to the back surface, for example, may be in a layer inside the carrier substrate 41.

Second Embodiment

Figure 8:
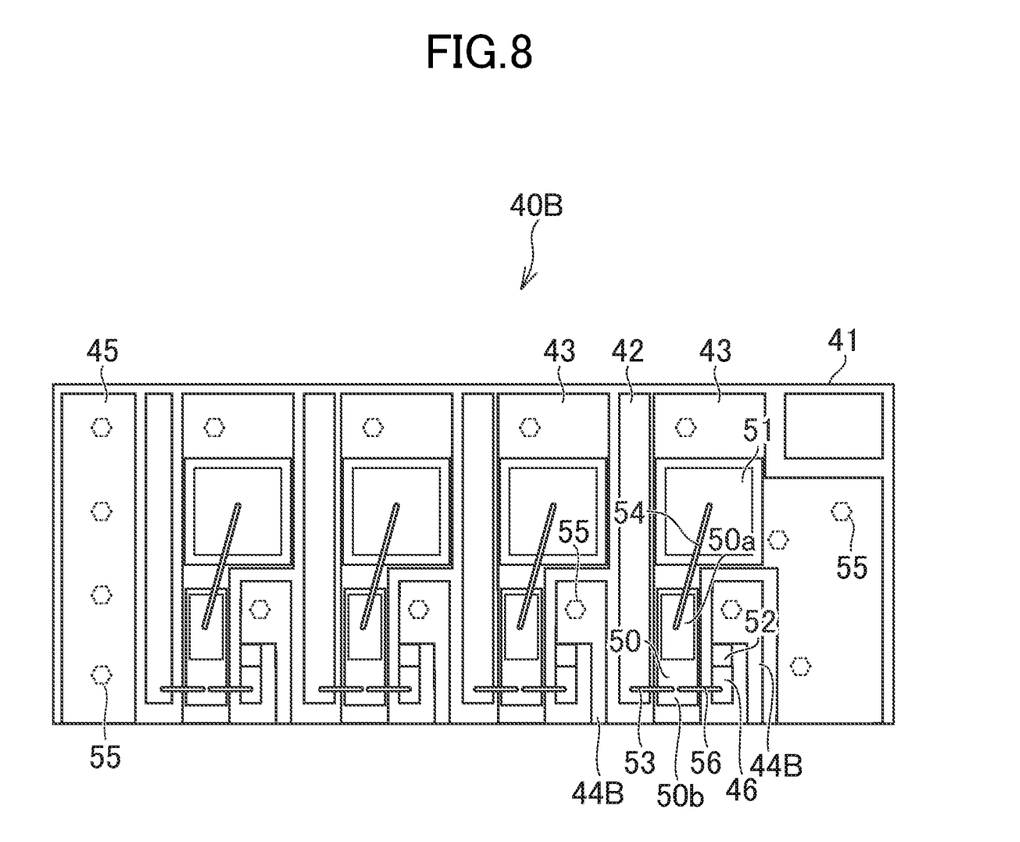
FIG. 8 is a schematic top view of a chip carrier in a second embodiment.

FIG. 8 is a schematic top view of a chip carrier 40B in a second embodiment, and shows an example of the mounting surface of the chip carrier 40B and elements and conductive patterns disposed thereon. Hereinafter, explanations of the present embodiment about the points in common with the first embodiment will be omitted, and only the basic differences are explained.

FIGS. 1 and 2 for the first embodiment are incorporated by reference for the second embodiment, wherein the chip carrier 40B, just like the chip carrier 40 in the first embodiment, is incorporated in the TOSA 30a of the optical transceivers 10. The main difference between the chip carrier 40B in the present embodiment and the chip carrier 40 in the first embodiment is the direction of connecting the electrodes at both ends of the resistor 52. That is, the direction from the connection point with the surface layer electrode 46 of the resistor 52 toward the connection point with the second conductive pattern 44 is the Y direction in the first embodiment, whereas it is the X direction, i.e., parallel to the extending direction of the strip conductor 42 of the transmission line in the present embodiment. Incidentally, corresponding to the difference in the layout, the shape of the second conductive pattern 44 may be different between the first embodiment and the second embodiment, accordingly the second conductive pattern in FIG. 8 bears a reference numeral 44B.

In the present embodiment, the direction of the current generated in the resistor 52 by the drive signal is different from that in the first embodiment, but the first conductive pattern 43 and the second conductive pattern 44B are separated, whereby the current is prevented from flowing through the conductive pattern on the mounting surface to the ground conductor of the loop 66 described above. This can suppress the impact on the loop 66 from the magnetic field due to the current generated in the resistor 52, and suppress the potential variation of the semiconductor laser unit 50a due to the modulation signals in the same manner as in the first embodiment.

In the configuration shown in FIG. 8, one electrode of the resistor 52 is directly connected to the conductive pattern 44B, or a DC blocking capacitor may be inserted between the electrode of the resistor 52 and the conductive pattern 44B, just like the first embodiment. With this configuration, it is possible to cut off the DC current that has occurred in the resistor 52 by the bias voltage applied to the optical modulator unit 50b, achieving the effect of reducing the power consumption of the optical module.

What is claimed is:

1. An optical module comprising:
   semiconductor devices including respective semiconductor laser units and respective optical modulator units;
   a chip carrier with a mounting surface on which the semiconductor devices are mounted;
   transmission lines on the chip carrier for the respective optical modulator units, each of the transmission lines configured to transmit a drive signal to a corresponding one of the optical modulator units;
   resistors on the mounting surface, each of the resistors provided for a corresponding one of the transmission lines and configured to terminate the drive signal;
   first conductive patterns on the mounting surface, each of the first conductive patterns connected to one electrode of a corresponding one of the semiconductor laser units and one electrode of the corresponding one of the optical modulator units;

chip capacitors on the mounting surface for the respective semiconductor laser units, each of the chip capacitors having one electrode connected to another electrode, to which a DC voltage is supplied, of the corresponding one of the semiconductor laser units through a bonding wire, each of the chip capacitors having another electrode connected to a corresponding one of the first conductive patterns that is connected to the corresponding one of the semiconductor laser units;

second conductive patterns on the mounting surface, the second conductive patterns separated from the first conductive patterns, each of the second conductive patterns connected to one electrode of a corresponding one of the resistors, directly or through a DC blocking capacitor; and third conductive patterns on a surface opposite to the mounting surface of the chip carrier or in an inner layer of the chip carrier, each of the third conductive patterns connected to the corresponding one of the first conductive patterns through a first conductive via hole in the chip carrier, and connected to a corresponding one of the second conductive patterns through a second conductive via hole in the chip carrier, wherein another electrode of the corresponding one of the resistors is connected to another electrode of the corresponding one of the optical modulator units through a bonding wire, and the corresponding one of the first conductive patterns is separated from but electrically connected to the corresponding one of the second conductive patterns through a corresponding one of the third conductive patterns.

2. The optical module according to claim 1, wherein
the transmission lines are waveguides with signal line conductors and a ground conductor parallel to the signal line conductors, each of the signal line conductors connected through a bonding wire to another electrode of the corresponding one of the optical modulator units and another electrode of the corresponding one of the resistors, at least part of each of the transmission lines being a grounded coplanar waveguide with the ground conductor, the ground conductor including the first conductive patterns, to which the semiconductor devices and the chip capacitors are connected in response to the respective transmission lines, the ground conductor including the third conductive patterns, and each of the semiconductor devices and each of the chip capacitors, on the corresponding one of the first conductive patterns, are adjacent to a corresponding one of the signal line conductors of the corresponding one of the transmission lines.

3. The optical module according to claim 2, wherein
the semiconductor devices are n semiconductor devices, where the n is an integer of two or more, arranged in a row along a first direction on the mounting surface,
each of the transmission lines extends in a second direction perpendicular to the first direction,
the first conductive patterns, the second conductive patterns, and the signal line conductors include a j-th first conductive pattern, a j-th second conductive pattern, and a j-th signal line conductor, respectively, corresponding to a j-th one of the semiconductor devices from an end of the row, where the j is an arbitrary natural number of the n or less,
the j-th second conductive pattern is opposite to the j-th signal line conductor across the j-th one of the semiconductor devices,
the transmission lines include one section and another section, serving as the ground conductor, on each of both sides of a k-th one of the signal line conductors, where the k is an arbitrary natural number equal to or less than n-1,
the one section includes a k-th one and a (k+1)-th one of the first conductive patterns, and
the other section includes the k-th one of the first conductive patterns and a (k+1)-th one of the second conductive patterns.

4. The optical module according to claim 1, wherein
the semiconductor devices are arranged in a row in a first direction on the mounting surface at one end of the chip carrier in a second direction intersecting the first direction, and
the transmission lines have respective input terminals at another end of the chip carrier in the second direction.

* * * * *